United States Patent
Yamazaki et al.

(10) Patent No.: US 9,109,286 B2
(45) Date of Patent: Aug. 18, 2015

(54) METHOD OF MANUFACTURING POWER STORAGE DEVICE

(75) Inventors: Shunpei Yamazaki, Tokyo (JP); Yasuyuki Arai, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 517 days.

(21) Appl. No.: 13/159,602

(22) Filed: Jun. 14, 2011

(65) Prior Publication Data

US 2011/0308935 A1 Dec. 22, 2011

(30) Foreign Application Priority Data

Jun. 18, 2010 (JP) ................. 2010-139255

(51) Int. Cl.
*C23C 14/34* (2006.01)
*C23C 16/40* (2006.01)
*C23C 14/06* (2006.01)
(Continued)

(52) U.S. Cl.
CPC .......... *C23C 16/40* (2013.01); *C23C 14/0676* (2013.01); *C23C 14/3414* (2013.01); *H01M 4/0428* (2013.01); *H01M 10/052* (2013.01); *H01M 10/058* (2013.01); *H01G 11/50* (2013.01); *H01G 11/86* (2013.01); *Y02E 60/122* (2013.01)

(58) Field of Classification Search
CPC   C23C 14/0676; C23C 14/3414; C23C 16/40; H01M 4/0428; H01M 10/052; H01M 10/058; H01G 11/50; H01G 11/86; Y02E 60/122
USPC ............ 204/192.15; 427/58, 78, 248.1, 255.7
See application file for complete search history.

(56) References Cited

U.S. PATENT DOCUMENTS 4,740,431 A * 4/1988 Little .............................. 429/9
6,448,951 B1 9/2002 Sakaguchi et al.
(Continued)

FOREIGN PATENT DOCUMENTS

CN    101447586    6/2009
CN    101485031    7/2009
(Continued)

OTHER PUBLICATIONS

Fragnaud et al. "Thin film cathodes for secondary lithium batteries", Journal of Power Sources 54 (1995), pp. 362-366. NO MONTH.*

(Continued)

*Primary Examiner* — Rodney McDonald
(74) *Attorney, Agent, or Firm* — Nixon Peabody LLP; Jeffrey L. Costellia (57) ABSTRACT

An object is to provide a method of manufacturing a lithium-ion secondary battery suitable for mass production. A lithium-ion secondary battery is manufactured in such a manner that a positive electrode layer is formed on a base including a plane by chemical vapor deposition which is specifically metal-organic chemical vapor deposition, an electrolyte layer is formed on the positive electrode layer, and a negative electrode layer is formed on the electrolyte layer. The positive electrode layer is formed with a MOCVD apparatus. The MOCVD apparatus is an apparatus with which a liquid or a solid of an organic metal raw material is vaporized to produce a gas and the gas is reacted to undergo pyrolysis so that a film is formed. By forming all the layers using sputtering, evaporation, or chemical vapor deposition, a solid lithium-ion secondary battery can also be realized.

14 Claims, 4 Drawing Sheets

(51) Int. Cl.
*H01M 4/04* (2006.01)
*H01M 10/052* (2010.01)
*H01M 10/058* (2010.01)
*H01G 11/50* (2013.01)
*H01G 11/86* (2013.01)

(56) References Cited

U.S. PATENT DOCUMENTS

| | | |
|---|---|---|
| 6,590,553 B1 | 7/2003 | Kimura et al. |
| 6,597,348 B1 | 7/2003 | Yamazaki et al. |
| 6,777,134 B2 * | 8/2004 | Mori et al. ............... 429/231.95 |
| 6,873,311 B2 | 3/2005 | Yoshihara et al. |
| 6,882,012 B2 | 4/2005 | Yamazaki et al. |
| 6,903,731 B2 | 6/2005 | Inukai |
| 7,113,164 B1 | 9/2006 | Kurihara |
| 7,122,279 B2 * | 10/2006 | Tamura et al. ............ 429/231.95 |
| 7,145,536 B1 | 12/2006 | Yamazaki et al. |
| 7,193,593 B2 | 3/2007 | Koyama et al. |
| 7,224,339 B2 | 5/2007 | Koyama et al. |
| 7,268,756 B2 | 9/2007 | Koyama et al. |
| 7,317,438 B2 | 1/2008 | Yamazaki et al. |
| 7,362,304 B2 | 4/2008 | Takatori et al. |
| 7,385,579 B2 | 6/2008 | Satake |
| 7,403,177 B2 | 7/2008 | Tanada et al. |
| 7,425,937 B2 | 9/2008 | Inukai |
| 7,564,443 B2 | 7/2009 | Takatori et al. |
| 7,702,705 B2 | 4/2010 | Suzuki |
| 7,773,066 B2 | 8/2010 | Yamazaki et al. |
| 7,791,571 B2 | 9/2010 | Ohtani et al. |
| 7,834,830 B2 | 11/2010 | Yamazaki et al. |
| 7,855,770 B2 | 12/2010 | Egi et al. |
| 7,941,471 B2 | 5/2011 | Katz et al. |
| 2002/0000960 A1 | 1/2002 | Yoshihara et al. |
| 2002/0044140 A1 | 4/2002 | Inukai |
| 2002/0075249 A1 | 6/2002 | Kubota et al. |
| 2004/0056831 A1 | 3/2004 | Takatori et al. |
| 2004/0113906 A1 | 6/2004 | Lew et al. |
| 2004/0257324 A1 | 12/2004 | Hsu |
| 2005/0012097 A1 | 1/2005 | Yamazaki |
| 2007/0139354 A1 | 6/2007 | Kim et al. |
| 2007/0216616 A1 | 9/2007 | Stessen |
| 2007/0218360 A1 | 9/2007 | Tabuchi et al. |
| 2007/0279359 A1 | 12/2007 | Yoshida et al. |
| 2007/0279374 A1 | 12/2007 | Kimura et al. |
| 2008/0138709 A1 | 6/2008 | Hatta et al. |
| 2008/0148555 A1 | 6/2008 | Roozeboom et al. |
| 2008/0158170 A1 | 7/2008 | Takatori et al. |
| 2008/0238336 A1 | 10/2008 | Peng et al. |
| 2009/0028460 A1 | 1/2009 | Jung et al. |
| 2009/0087730 A1 | 4/2009 | Kondo et al. |
| 2009/0138862 A1 | 5/2009 | Tanabe et al. |
| 2009/0142668 A1 | 6/2009 | Ishii |
| 2009/0167670 A1 | 7/2009 | Peng et al. |
| 2009/0193649 A1 | 8/2009 | Niessen et al. |
| 2009/0219243 A1 | 9/2009 | Chen |
| 2009/0237004 A1 | 9/2009 | Ploquin et al. |
| 2009/0262308 A1 | 10/2009 | Ogawa |
| 2009/0321737 A1 | 12/2009 | Isa et al. |
| 2010/0084615 A1 | 4/2010 | Levasseur et al. |
| 2010/0148177 A1 | 6/2010 | Koyama et al. |
| 2010/0149084 A1 | 6/2010 | Chida |
| 2010/0182282 A1 | 7/2010 | Kurokawa et al. |
| 2010/0235418 A1 | 9/2010 | Dong |
| 2010/0297496 A1 | 11/2010 | Ravet et al. |
| 2010/0321420 A1 | 12/2010 | Ohtani et al. |
| 2010/0327222 A1 | 12/2010 | Levasseur et al. |
| 2011/0001725 A1 | 1/2011 | Kurokawa |
| 2011/0025729 A1 | 2/2011 | Yamazaki et al. |
| 2011/0051034 A1 | 3/2011 | Egi et al. |
| 2011/0062972 A1 | 3/2011 | Je et al. |
| 2011/0157216 A1 | 6/2011 | Yamazaki et al. |
| 2011/0157253 A1 | 6/2011 | Yamazaki et al. |

FOREIGN PATENT DOCUMENTS

| | | |
|---|---|---|
| CN | 101558517 | 10/2009 |
| CN | 101605722 | 12/2009 |
| EP | 2 192 640 A1 | 6/2010 |
| JP | 59-060866 A | 4/1984 |
| JP | 60-072168 A | 4/1985 |
| JP | 62-044960 A | 2/1987 |
| JP | 62-108470 A | 5/1987 |
| JP | 10-083838 | 3/1998 |
| JP | 11-025983 | 1/1999 |
| JP | 2002-062518 A | 2/2002 |
| JP | 2004-335192 | 11/2004 |
| JP | 2005-050684 | 2/2005 |
| JP | 2006-220685 A | 8/2006 |
| JP | 2007-264211 A | 10/2007 |
| JP | 2008-532238 | 8/2008 |
| JP | 2009-004289 | 1/2009 |
| JP | 2009-004371 | 1/2009 |
| JP | 2009-042405 A | 2/2009 |
| JP | 2009-064644 | 3/2009 |
| JP | 2009-104983 | 5/2009 |
| JP | 2009-129179 | 6/2009 |
| JP | 2009-129644 | 6/2009 |
| JP | 2009-152188 | 7/2009 |
| JP | 2009-181807 | 8/2009 |
| JP | 2009-259583 | 11/2009 |
| JP | 2009-266813 | 11/2009 |
| JP | 2009-277661 | 11/2009 |
| JP | 2009-543285 | 12/2009 |
| JP | 2010-003700 | 1/2010 |
| JP | 2010-027301 | 2/2010 |
| JP | 2010-508234 | 3/2010 |
| JP | 2010-080210 | 4/2010 |
| JP | 2010-513193 | 4/2010 |
| JP | 2010-212037 | 9/2010 |
| JP | 2011-076820 | 4/2011 |
| KR | 2009-0056884 | 6/2009 |
| KR | 2009-0087456 | 8/2009 |
| KR | 2009-0102793 | 9/2009 |
| WO | WO 2004-068620 A1 | 8/2004 |
| WO | WO-2006/092747 | 9/2006 |
| WO | WO-2008/004161 A2 | 1/2008 |
| WO | WO-2008/062111 A2 | 5/2008 |
| WO | WO-2008/077448 A1 | 7/2008 |
| WO | WO 2009/066782 A2 | 5/2009 |
| WO | WO 2009084966 * | 7/2009 |
| WO | WO-2010/007899 A1 | 1/2010 |
| WO | WO-2010/104017 A1 | 9/2010 |

OTHER PUBLICATIONS

"INTERNATIONAL SEARCH REPORT (Application No. PCT/JP2011/063990; PCT13648) Dated Sep. 13, 2011"

"WRITTEN OPINION (Application No. PCT/JP2011/063990; PCT13648) Dated Sep. 13, 2011"

"Preparation of Iron Oxide Thin Films by MOCVD" Journal of the Ceramic Society of Japan vol. 104, No. 10, pp. 949-952 (1996).

Kang et al., "Battery materials for ultrafast charging and discharging", Nature, vol. 458, Mar. 12, 2009, pp. 190-193.

Kang et al., "Battery materials for ultrafast charging and discharging", Nature, vol. 458, No. 12, Mar. 12, 2009, pp. 190-193.

P. Baron et al., "36.4: Can Motion Compensation Eliminate Color Breakup of Moving Objects in Field-Sequential Color Displays?", *SID DIGEST '96 : SID International Symposium DIGEST of Technical Papers*, 1996, vol. 27, pp. 843-846.

Kurita T. et al., "Evaluation and Improvement of Picture Quality for Moving Images on Field-sequential Color Displays", *IDW '00 : PROCEEDINGS of the 17th International Display Workshops*, 2000, pp. 69-72.

Taira K. et al., "A15" Field-Sequential Display without Color Break-Up using an AFLC Color Shutter, *IDW '00 : Proceedings of The 17th International Display Workshops*, 2000, pp. 73-76.

T. Jarvenpaa, "7.2: Measuring Color Breakup of Stationary Images in Field-Sequential-Color Displays", *SID DIGEST '04 : SID International Symposium Digest of Technical Papers*, 2004, vol. 35, pp. 82-85.

* cited by examiner

METHOD OF MANUFACTURING POWER STORAGE DEVICE

TECHNICAL FIELD

A disclosed embodiment of the present invention relates to a method of manufacturing a power storage device and particularly a method of manufacturing a lithium-ion secondary battery.

BACKGROUND ART

A significant advance has been made in the field of portable electronic devices, such as personal computers and cellular phones. For the portable electronic devices, there has been need of a chargeable power storage device having a high energy density, which is small, lightweight, and reliable. As such a power storage device, a lithium-ion secondary battery is known, for example. In addition, development of electrically propelled vehicles incorporating secondary batteries has rapidly advanced with a growing awareness to environmental problems and energy problems.

For a lithium-ion secondary battery, lithium metal oxide is used as a positive electrode material. The lithium metal oxide is a source of supply of lithium for the positive electrode.

Further, complete solidification of a lithium-ion secondary battery is under development (see Patent Document 1).

REFERENCE

Patent Document

Patent Document 1: Japanese Published Patent Application No. 2009-64644

DISCLOSURE OF INVENTION

If a positive electrode layer is formed by a technique in which a powder of a raw material is pressured into a pellet shape and then a lithium-ion secondary battery is manufactured, mass production providing inexpensive products is difficult to realize.

An object of one embodiment of the present invention is to provide a method of manufacturing a lithium-ion secondary battery suitable for mass production.

One embodiment of the present invention disclosed in this specification is a method of manufacturing a power storage device, in which a positive electrode layer is formed on a base including a plane by a chemical vapor deposition method which is specifically a metal-organic chemical vapor deposition method, an electrolyte layer is formed on the positive electrode layer, and a negative electrode layer is formed on the electrolyte layer.

With the above structure, at least the above problem can be solved.

Another embodiment is a method of manufacturing a power storage device, in which a negative electrode layer is formed on a base including a plane, an electrolyte layer is formed on the negative electrode layer, and a positive electrode layer is formed on the electrolyte layer by a chemical vapor deposition method which is specifically a metal-organic chemical vapor deposition method.

For the positive electrode layer, a film can be formed by a metal-organic chemical vapor deposition method, and there is no particular limitation as far as the positive electrode layer contains a positive electrode active material. As the positive electrode active material, a material known as an active material for a secondary battery can be used without particular limitation. Examples of the positive electrode active material are transition metal oxides containing lithium, such as $LiFePO_4$, $LiMn_2O_4$, and $LiMnPO_4$.

Note that the positive electrode layer may have a stacked layer structure, for example, a structure in which a positive electrode current collector and a positive electrode are stacked. Further, the base having a plane may be used as the positive electrode current collector.

Furthermore, the negative electrode layer is preferably formed by a sputtering method, an evaporation method, or a chemical vapor deposition method, such as a metal-organic chemical vapor deposition method. By forming all the layers using a sputtering method, an evaporation method, or a chemical vapor deposition method, a solid lithium-ion secondary battery suitable for mass production can be realized. Moreover, if all the layers can be formed by a sputtering method, an evaporation method, or a chemical vapor deposition method, formation on a flexible film is made possible with a manufacturing apparatus employing a roll-to-roll method.

For the negative electrode layer, there is no particular limitation as far as it contains a negative electrode active material. As the negative electrode active material, a material known as an active material for a secondary battery can be used without particular limitation. Examples of the negative electrode active material are silicon, carbon, aluminum, and the like.

Note that the negative electrode layer may have a stacked layer structure, for example, a structure in which a stack of a negative electrode current collector and a negative electrode are stacked. Further, the base having a plane may be used as the negative electrode current collector.

Further, for the electrolyte layer, a solid electrolyte that enables formation by a sputtering method, an evaporation method, or a chemical vapor deposition method (specifically a metal-organic chemical vapor deposition method) is used. For example, the electrolyte layer is preferably formed using a phosphorus compound, specific examples of which are lithium phosphate ($Li_3PO_4$) and compounds thereof (e.g., $Li_2S$—$SiS_2$—$Li_3PO_4$, LiPOTi, LiPON, and LiCON).

Since a positive electrode layer is formed by a chemical vapor deposition method so that a lithium secondary battery is manufactured, the structure of the battery can be simple and the manufacture can be easy.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, an example of a structure of a lithium secondary battery and an example of a method of manufacturing the lithium secondary battery will be described.

Figure 1:
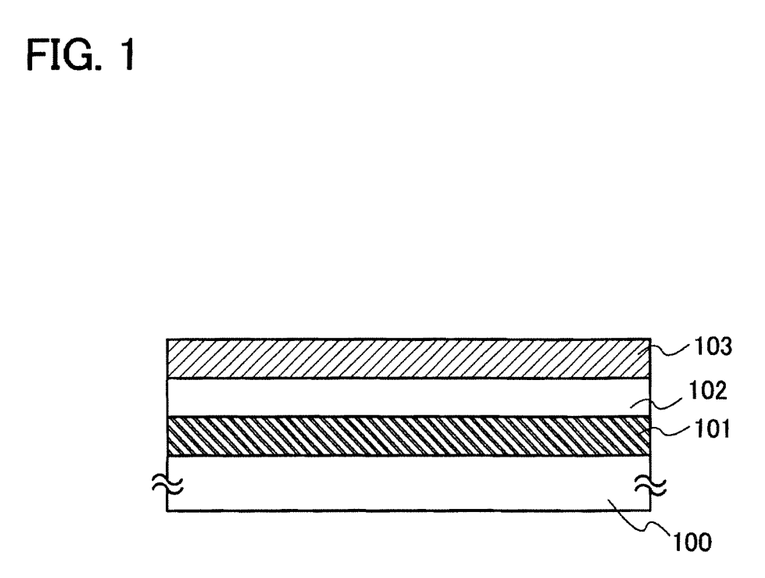
FIG. 1 is a cross-sectional view illustrating one embodiment of the present invention.

The lithium secondary battery, a cross section of which is illustrated in FIG. 1, includes a positive electrode layer 101 which is provided over a base 100, an electrolyte layer 102 which is provided over the positive electrode layer, and a negative electrode layer 103 which is provided over the electrolyte layer. Note that a stack of a positive electrode current collector and a positive electrode may be used as the positive electrode layer. Further, a stack of a negative electrode and a negative electrode current collector may be used as the negative electrode layer.

The base 100 specifically refers to a substrate, for which glass or a ceramic material, such as aluminum oxide, is used. Note that when a material that can be used for the positive electrode current collector is used for the base, the base itself can also be the positive electrode current collector.

The base is transferred into a MOCVD apparatus, a reaction gas is introduced thereinto and a gas phase reaction is made to take place, so that the positive electrode layer is formed. The MOCVD apparatus refers to an apparatus with which a liquid or a solid of an organic metal raw material is vaporized to produce a gas and the gas is reacted to undergo pyrolysis so that a film is formed. Lithium tert-butoxide (abbreviation: LTB) and iron(III) acetylacetonate (chemical formula: $Fe(C_5H_7O_2)_3$ (abbreviation: $Fe(acac)_3$)) are used for the reaction gas, and a film is formed as the positive electrode layer containing lithium iron oxide. The temperature for the pyrolysis can be 300° C. to 600° C.

Figure 2A:
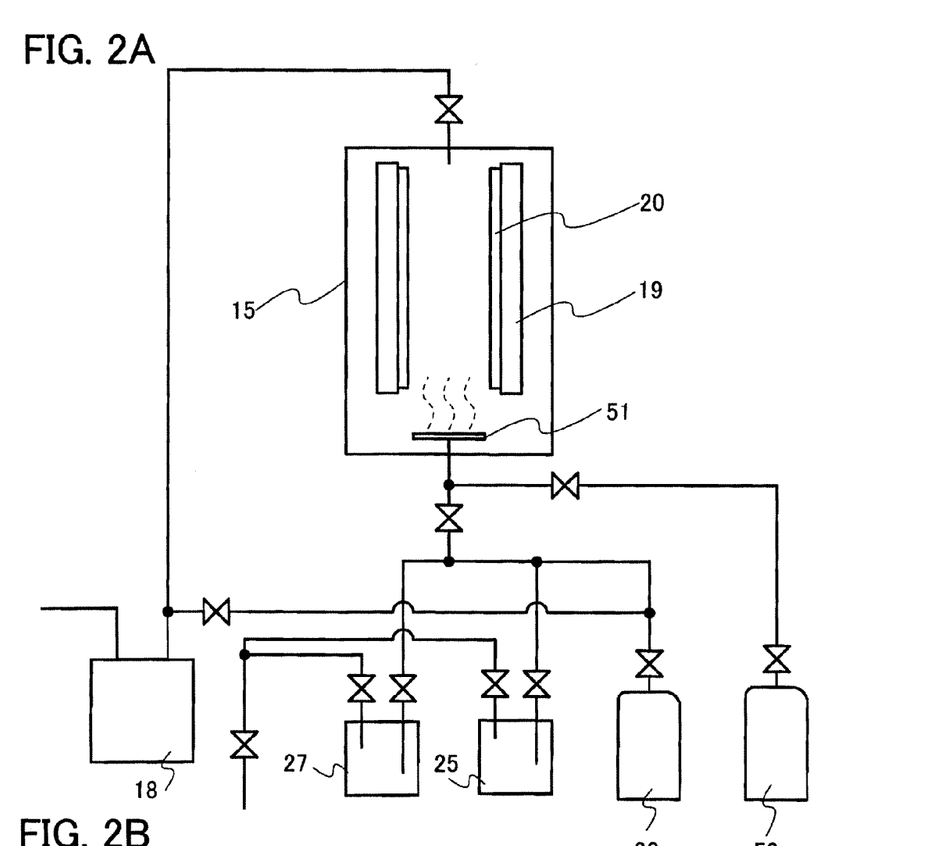
FIGS. 2A and 2B are a cross-sectional view of a MOCVD apparatus and a top view of a manufacturing apparatus.

An example of a structure of the MOCVD apparatus is illustrated in FIG. 2A.

A substrate stage 19 on which a substrate is heated is provided for a MOCVD chamber 15 having a vacuum chamber. A substrate 20 is held by the substrate stage 19. A shower head 51 from which a source gas blows is placed in the vacuum chamber of the MOCVD chamber 15.

Together with a carrier gas, the source gas is supplied from a raw material vessel 25, in which a metal complex raw material is held, and the source gas flows into the vacuum chamber of the MOCVD chamber 15 through the shower head 51. The raw material vessel 25 is provided with a heater so that the metal complex raw material can be heated. The same can be applied to a structure of a raw material vessel 27.

As in this embodiment, when lithium tert-butoxide (abbreviation: LTB) and iron(III) acetylacetonate (chemical formula: $Fe(C_5H_7O_2)_3$ are used, a mixture of the organic metal vapors is supplied with the shower head 51 into the vacuum chamber of the MOCVD chamber 15 using the two raw material vessels. When phosphine ($PH_3$), phosphorus trifluoride ($PF_3$), or phosphorus trichloride ($PCl_3$) is used as a phosphorus source, the source is supplied from a cylinder 23 into the vacuum chamber of the MOCVD chamber 15. Furthermore, pipe arrangement is structured such that an oxygen gas is supplied from a cylinder 52 and mixed with the source gas before reaching the shower head 51, and reaction of oxygen and a metal complex in the pipe arrangement is prevented.

The vacuum chamber of the MOCVD chamber 15 is connected to an exhaust portion 18. An exhaust pathway may be provided with an automatic pressure control valve (also referred to as an APC) by which the pressure in the vacuum chamber of the MOCVD chamber 15 is controlled. An exhaust processing apparatus includes, for example, a harm abatement apparatus for rendering the source gas used harmless or the like if the gas is harmful.

Figure 2B:
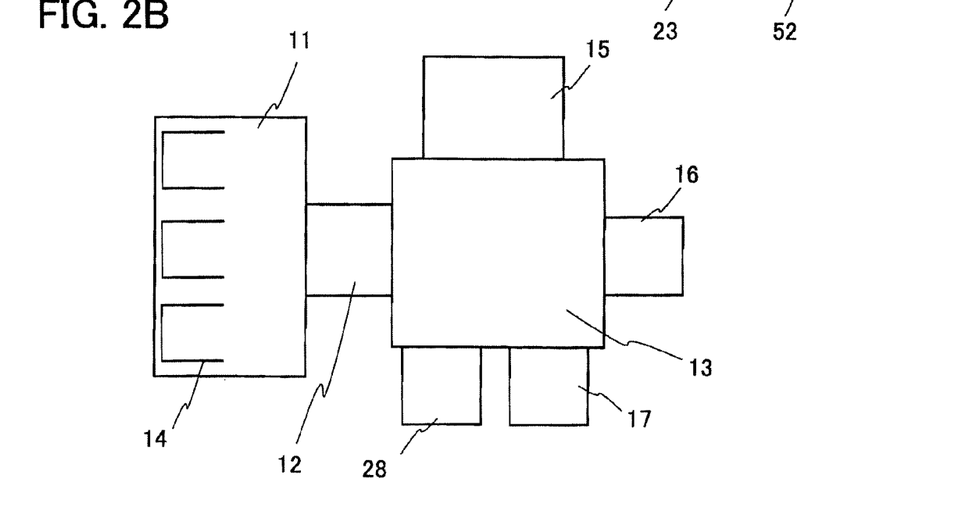

Further, a top view of a single wafer multi-chamber manufacturing apparatus including the MOCVD apparatus as a film formation chamber is illustrated in FIG. 2B. The manufacturing apparatus includes a transfer chamber 13 which is connected to each of the MOCVD chamber 15, sputtering chambers 16 and 28, and an evaporation chamber 17, and further includes a load lock chamber 12 which is connected to the transfer chamber 13, a substrate supply chamber 11 which includes three cassette ports 14 for accommodating a process substrate, and the like. Note that a transfer robot for transferring the base or turning the base upside down is placed in each of the substrate supply chamber 11 and the transfer chamber 13.

Then, after the film formation for the positive electrode layer, the base is transferred to the sputtering chamber 16 without exposure to the atmosphere, and the electrolyte layer is formed. For the electrolyte layer, a LiPON film is formed in such a manner that an RF magnetron sputtering method is used with lithium phosphate ($Li_3PO_4$) as a target and nitrogen is introduced into the film formation chamber of the sputtering chamber 16.

Next, after the film formation for the electrolyte layer, the base is transferred to the evaporation chamber 17 without exposure to the atmosphere and part of the negative electrode layer is formed. Lithium fluoride stored in a container is evaporated by a resistance heating method to form a lithium fluoride film on the electrolyte layer, lithium stored in a container is evaporated by an electron beam method to form a lithium film on the lithium fluoride film, and lithium fluoride stored in a container is further evaporated by a resistance heating method to form a lithium fluoride film on the lithium film. Next, after the film formation for the lithium fluoride film, the base is transferred to the sputtering chamber 28 without exposure to the atmosphere and a film is formed as a layer containing copper. In this embodiment, the negative electrode layer has a four-layer structure including the lithium fluoride film, the lithium film, the lithium fluoride film, and the layer containing copper in this order.

Note that a region in which part of the positive electrode layer is exposed is formed for connection to an external terminal. In order to do that, it is preferable to selectively perform film formation using a metal mask or the like as appropriate.

Through the above process, the lithium-ion secondary battery illustrated in FIG. 1 can be manufactured.

As in this embodiment, a MOCVD method is used in such a manner that a metal complex, a hydride, or a halide of an element used as a raw material for manufacturing the positive electrode active material undergoes pyrolysis to be deposited on the positive electrode current collector, so that the positive electrode active material layer can be a thin layer.

By a MOCVD method as performed above, the positive electrode active material layer can be formed to a thickness ranging from 0.1 μm to 10 μm, preferably from 0.2 μm to 1 μm. Further, lithium, the melting point of which is relatively low, is lost, and the positive electrode active material layer can be manufactured to contain a lithium vacancy. Lithium in the positive electrode active material layer is thought to move by hopping such a vacancy, which leads to realization of rapid charge and discharge of the lithium-ion secondary battery, together with a reduction in the thickness of the positive electrode active material layer.

The lithium-ion secondary battery thus obtained can be utilized as a power supply of a portable electronic device.

Embodiment 2

In this embodiment, an example of a method of manufacturing a lithium secondary battery, which differs from that described in Embodiment 1, will be described.

The base is transferred into a MOCVD apparatus, a reaction gas is introduced thereinto, and a gas phase reaction is made to take place, so that the positive electrode layer is formed. Lithium tert-butoxide (abbreviation: LTB) and a dipivaloylmethanato (DPM) chelate compound of Mn (Mn(DPM)$_3$) or tris(2,2,6,6-tetramethyl-3,5-heptanedionato) manganese(III) [abbreviated as Mn(thd)$_3$] are used for the reaction gas, and a film is formed as the positive electrode layer containing LiMn$_2$O$_4$.

Next, after the film formation for the positive electrode layer, the base is transferred to a sputtering apparatus without exposure to the atmosphere and the electrolyte layer is formed. For the electrolyte layer, a film is formed as the electrolyte layer of Li$_2$O—V$_2$O$_5$—SiO$_2$ in such a manner that an RF magnetron sputtering method is used with a target containing Li$_2$CO$_3$, V$_2$O$_5$, and SiO$_2$ mixed in a predetermined ratio and nitrogen is introduced into the film formation chamber.

Next, after the film formation for the electrolyte layer, the base is transferred to an evaporation apparatus without exposure to the atmosphere, and lithium stored in a container is evaporated by an electron beam method to form a negative electrode layer including a lithium film on the electrolyte layer. Then, after the film formation for the negative electrode layer including a lithium film, the base is transferred to the sputtering apparatus without exposure to the atmosphere, and a film is formed as a layer containing titanium which covers the negative electrode layer. Note that copper or nickel may be used instead of titanium, and lithium is prevented from being exposed to the atmosphere.

Through the above process, the lithium-ion secondary battery illustrated in FIG. 1 can be manufactured. This lithium-ion secondary battery can be utilized as a power supply of a portable electronic device.

Embodiment 3

In this embodiment, an example of a method of manufacturing a lithium secondary battery, which differs in stack order from the method described in Embodiment 1, will be described.

Figure 3:
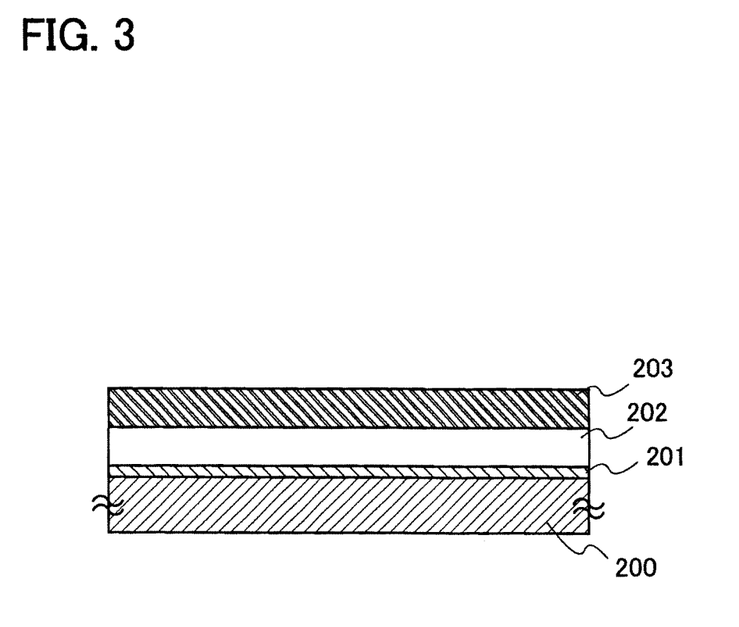
FIG. 3 is a cross-sectional view illustrating one embodiment of the present invention.

In this embodiment, an example is described in which a copper substrate is used as a base 200 for use as the negative electrode current collector, as illustrated FIG. 3.

The base 200 is transferred to the evaporation apparatus, and lithium stored in a container is evaporated by an electron beam method to form a negative electrode layer 201 including a lithium film on the base 200. The base is transferred to the sputtering apparatus without exposure to the atmosphere, and an electrolyte layer 202 is formed. For the electrolyte layer, a LiPON film is formed in such a manner that an RF magnetron sputtering method is used with lithium phosphate (Li$_3$PO$_4$) as a target and nitrogen is introduced into the film formation chamber.

Next, after the film formation for the electrolyte layer, the base is transferred to the MOCVD apparatus without exposure to the atmosphere and a positive electrode layer 203 is formed. Lithium tert-butoxide (abbreviation: LTB), iron(III) acetylacetonate (chemical formula: Fe(C$_5$H$_7$O$_2$)$_3$ (abbreviation: Fe(acac)$_3$)), and phosphine or tertiarybutylphosphine (C$_4$H$_9$)PH$_2$ (abbreviation: TBP) are used for the reaction gas, and a film is formed as the positive electrode layer containing lithium iron oxide.

Through the above process, the lithium-ion secondary battery illustrated in FIG. 3 can be manufactured. This lithium-ion secondary battery can be utilized as a power supply of a portable electronic device.

Embodiment 4

In this embodiment, a structure of a lithium-ion secondary battery will be described using FIGS. 4A and 4B. An example in which a liquid such as a solvent is used for the electrolyte will be described in this embodiment.

A lithium-ion secondary battery using a metal oxide containing lithium, such as LiCoO$_2$, has a large discharge capacity and high safety. Therefore, a structure of a lithium-ion battery which is a typical example of a secondary battery will be described here.

Figure 4A:
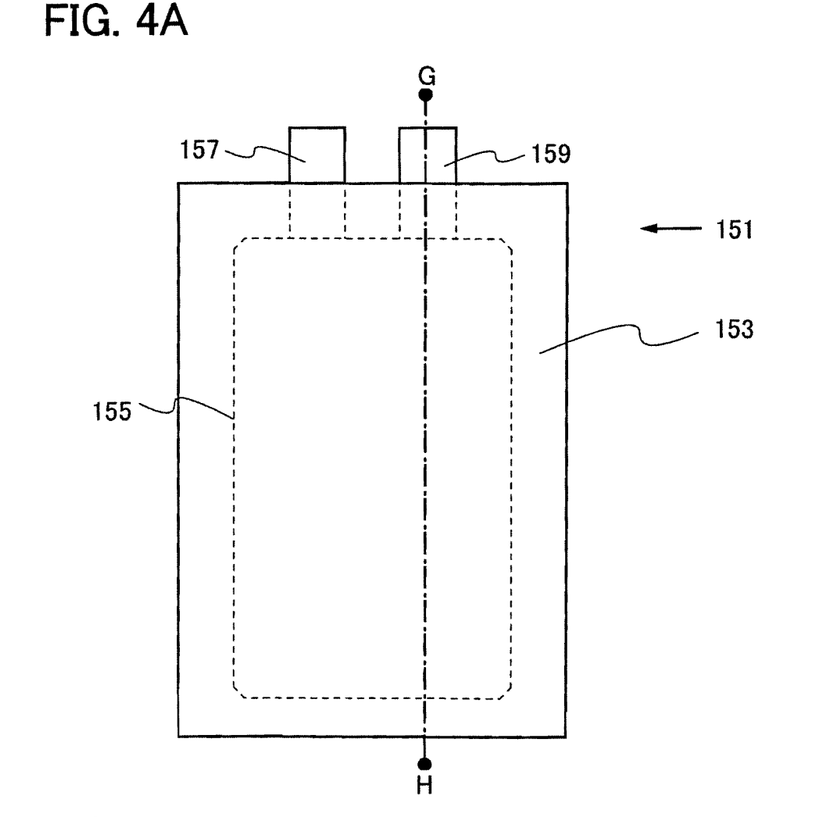
FIGS. 4A and 4B are a top view and a cross-sectional view illustrating one embodiment of the present invention.
Figure 4B:
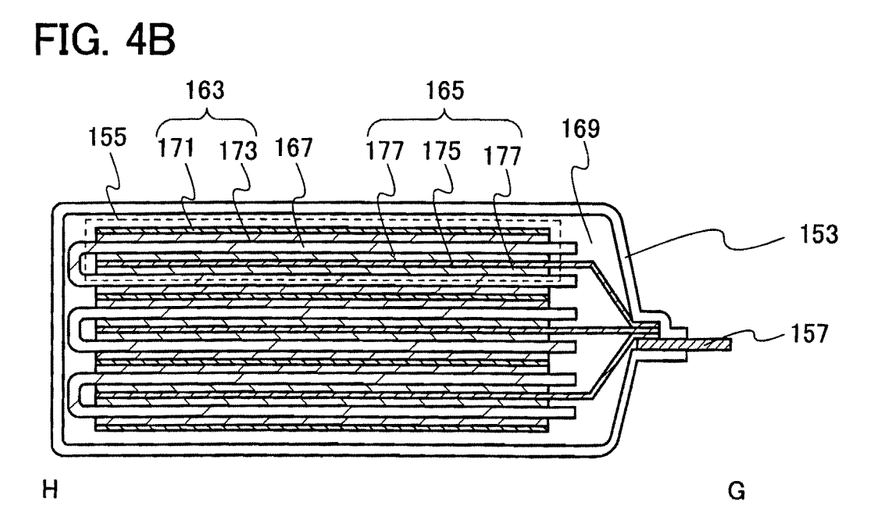

FIG. 4A is a plan view of a lithium-ion secondary battery 151, and FIG. 4B is a cross-sectional view taken along the line G-H in FIG. 4A.

The lithium-ion secondary battery 151 illustrated in FIG. 4A includes a power storage cell 155 in an exterior member 153, and further includes terminal portions 157 and 159 which are connected to the power storage cell 155. For the exterior member 153, a laminate film, a polymer film, a metal film, a metal case, a plastic case, or the like can be used.

As illustrated in FIG. 4B, the power storage cell 155 includes a negative electrode layer 163, a positive electrode layer 165, a separator 167 which is provided between the negative electrode layer 163 and the positive electrode layer 165, and an electrolyte 169 with which the exterior member 153 is filled.

The negative electrode layer 163 is formed to include a negative electrode current collector 171 and a negative electrode active material layer 173. The positive electrode layer 165 is formed to include a positive electrode current collector 175 and a positive electrode active material layer 177. The negative electrode active material layer 173 is formed on one or both of the surfaces of the negative electrode current collector 171. The positive electrode active material layer 177 is formed on one or both of the surfaces of the positive electrode current collector 175. As in Embodiment 1, the positive electrode active material layer 177 is formed by a sputtering method, an evaporation method, or a chemical vapor deposition method, such as a metal-organic chemical vapor deposition method.

Further, the negative electrode current collector 171 is connected to the terminal portion 159. In addition, the positive electrode collector 175 is connected to the terminal portion 157. Further, the terminal portions 157 and 159 each partly extend outside the exterior member 153.

Note that although a sealed thin power storage device is described as the lithium-ion secondary battery 151 in this embodiment, a power storage device having any of a variety of structures, such as a button power storage device, a cylindrical power storage device, and a rectangular power storage device, can be realized. Further, although the structure where the positive electrode layer, the negative electrode layer, and the separator are stacked is described in this embodiment, a structure where the positive electrode layer, the negative electrode layer, and the separator are rolled may be employed.

For the negative electrode active material layer 173, an active material layer formed with a crystalline silicon layer can be used. Note that the crystalline silicon layer may be pre-doped with lithium. In addition, the active material layer can be formed on either surface of the negative electrode current collector 171 at the same time in such a manner that the active material layer formed with the crystalline silicon layer is formed while the negative electrode current collector 171 is held by a frame-like susceptor in an LPCVD apparatus; thus, the number of process steps can be reduced.

Aluminum, stainless steel, or the like is used for the positive electrode current collector 175. For the positive electrode current collector 175, a shape such as a foil shape, a plate shape, a net shape, or the like can be used.

As a solute of the electrolyte 169, a material in which transport of lithium ions that are carrier ions is possible and the lithium ions are stably present is used. Typical examples of the solute of the electrolyte are lithium salts such as $LiClO_4$, $LiAsF_6$, $LiPF_6$, $Li(C_2F_5SO_2)_2N$, and the like. When carrier ions are ions of alkaline earth metals or alkali metals other than lithium, as the solute of the electrolyte 169, it is possible to use any of alkali metal salts such as sodium salts and potassium salts, beryllium salts, magnesium salts, alkaline earth metal salts such as calcium salts, strontium salts and barium salts, and the like as appropriate.

Further, as the solvent of the electrolyte 169, a material in which transport of lithium ions that are carrier ions is possible can be used. As the solvent of the electrolyte 169, an aprotic organic solvent is preferably used. Typical examples of aprotic organic solvents are ethylene carbonate, propylene carbonate, dimethyl carbonate, diethyl carbonate, γ-butyrolactone, acetonitrile, dimethoxyethane, tetrahydrofuran, and the like, one or more of which can be used. By using a polymer that undergoes gelation as the solvent of the electrolyte 169, safety including leakproof properties is enhanced. Further, the lithium-ion secondary battery 151 can be made thinner and more lightweight. Typical examples of the polymer that undergoes gelation are a silicon gel, an acrylic gel, an acrylonitrile gel, a polyethylene oxide, a polypropylene oxide, a fluorine-based polymer, and the like.

As the separator 167, an insulating porous material can be used. Typical examples of the separator 167 are cellulose (paper), polyethylene, polypropylene, and the like.

In a lithium ion battery, the memory effect is small, the energy density is high, the discharge capacity is large, and the operation voltage is high. Accordingly, the size and weight of the lithium ion battery can be reduced. Further, a reduction in deterioration due to repetitive charge and discharge allows use for a long time, so that cost can be reduced.

Note that a power storage device using an electrode which is a disclosed embodiment of the present invention is not limited to the above-described device.

This embodiment can be combined with any other embodiment.

REFERENCE NUMERALS

100: base, 101: positive electrode layer, 102: electrolyte layer, 103: negative electrode layer, 200: base, 201: negative electrode layer, 202: electrolyte layer, 203: positive electrode layer.

This application is based on Japanese Patent Application serial No. 2010-139255 filed with the Japan Patent Office on Jun. 18, 2010, the entire contents of which are hereby incorporated by reference.

The invention claimed is:

1. A method of manufacturing a power storage device, comprising:

forming a positive electrode layer on a base including a plane by a chemical vapor deposition method using a first material and a second material;

forming an electrolyte layer on the positive electrode layer; and forming a negative electrode layer on the electrolyte layer, wherein the negative electrode layer comprises a first lithium fluoride film, a lithium film on the first lithium fluoride film, and a second lithium fluoride film on the lithium film.

2. The method of manufacturing a power storage device, according to claim 1, wherein the chemical vapor deposition method is a metal-organic chemical vapor deposition method.

3. The method of manufacturing a power storage device, according to claim 1, wherein the negative electrode layer is formed by a sputtering method, an evaporation method, or a chemical vapor deposition method.

4. The method of manufacturing a power storage device, according to claim 1, wherein the electrolyte layer is formed by a sputtering method, an evaporation method, or a chemical vapor deposition method.

5. A method of manufacturing a power storage device, comprising:

forming a negative electrode layer on a base including a plane;

forming an electrolyte layer on the negative electrode layer; and forming a positive electrode layer on the electrolyte layer by a chemical vapor deposition method using a first material and a second material, wherein the negative electrode layer comprises a first lithium fluoride film, a lithium film on the first lithium fluoride film, and a second lithium fluoride film on the lithium film.

6. The method of manufacturing a power storage device, according to claim 5, wherein the chemical vapor deposition method is a metal-organic chemical vapor deposition method.

7. The method of manufacturing a power storage device, according to claim 5, wherein the negative electrode layer is formed by a sputtering method, an evaporation method, or a chemical vapor deposition method.

8. The method of manufacturing a power storage device, according to claim 5, wherein the electrolyte layer is formed by a sputtering method, an evaporation method, or a chemical vapor deposition method.

9. The method of manufacturing a power storage device, according to claim 1, wherein the second material comprises iron or manganese.

10. The method of manufacturing a power storage device, according to claim 1, wherein the second material comprises any one of iron(III) acetylacetonate, a dipivaloylmethanato chelate compound and tris(2,2,6,6-tetramethyl-3,5-heptanedionato) manganese(III).

11. The method of manufacturing a power storage device, according to claim 5, wherein the second material comprises iron or manganese.

12. The method of manufacturing a power storage device, according to claim 5, wherein the second material comprises any one of iron(III) acetylacetonate, a dipivaloylmethanato chelate compound and tris(2,2,6,6-tetramethyl-3,5-heptanedionato) manganese(III).

13. The method of manufacturing a power storage device, according to claim 1, wherein the first material comprises lithium tert-butoxide.

14. The method of manufacturing a power storage device, according to claim 5, wherein the first material comprises lithium tert-butoxide.

\* \* \* \* \*